US006759920B1

(12) United States Patent
Cheung et al.

(10) Patent No.: US 6,759,920 B1
(45) Date of Patent: Jul. 6, 2004

(54) MULTI-LAYER BALUN TRANSFORMER

(75) Inventors: Philip Cheung, Roseville, MN (US); Ramesh Harjani, Minneapolis, MN (US)

(73) Assignee: Bermai, Inc., Palo Alto, CA (US)

( * ) Notice: Subject to any disclaimer, the term of this patent is extended or adjusted under 35 U.S.C. 154(b) by 0 days.

(21) Appl. No.: 10/377,993

(22) Filed: Feb. 28, 2003

Related U.S. Application Data

(60) Provisional application No. 60/377,056, filed on Apr. 30, 2002.

(51) Int. Cl.[7] .................................................. H03H 7/42
(52) U.S. Cl. ........................................... 333/25; 333/26
(58) Field of Search ...................................... 333/25, 26

(56) References Cited

U.S. PATENT DOCUMENTS

| | | | | | |
|---|---|---|---|---|---|
| 5,886,589 | A | * | 3/1999 | Mourant | 333/26 |
| 6,018,277 | A | * | 1/2000 | Vaisanen | 333/26 |
| 6,040,745 | A | * | 3/2000 | Tanaka et al. | 333/26 |
| 6,097,273 | A | * | 8/2000 | Frye et al. | 336/200 |
| 6,133,806 | A | | 10/2000 | Sheen | |
| 6,201,439 | B1 | * | 3/2001 | Ishida et al. | 330/124 R |
| 6,278,340 | B1 | * | 8/2001 | Liu | 333/26 |
| 6,351,192 | B1 | | 2/2002 | Sheen | |
| 6,396,362 | B1 | | 5/2002 | Mourant et al. | |
| 6,437,658 | B1 | | 8/2002 | Apel et al. | |
| 2002/0113682 | A1 | | 8/2002 | Gevorgian et al. | |

OTHER PUBLICATIONS

Bushyager et al., "Multilayer Package Modeling Using the Multi–Resolution Time Domain Technique," School of ECE, Georgia Institute of Technology, Atlanta, GA.

* cited by examiner

*Primary Examiner*—Robert Pascal
*Assistant Examiner*—Dean Takaoka
(74) *Attorney, Agent, or Firm*—Shumaker & Sieffert, P.A.

(57) ABSTRACT

The invention provides a balun for coupling an unbalanced device with a balanced device. The balun may, for example, comprise an unbalanced balun structure having a first unbalanced component and a second unbalanced component electrically coupled to one another and a balanced balun structure having a first balanced component and a second balanced component. The first balanced component electromagnetically couples more than one side of the first unbalanced component and the second balanced component electromagnetically couples more than one side of the second unbalanced component. The unbalanced and balanced components may comprise conducting strips, such as strip lines, disposed on a dielectric layer. The balun may be formed on multiple layers or only a single layer. The balun receives unbalanced signals and outputs balanced signals, i.e., signals with a 180-degree phase shift and vice versa.

35 Claims, 9 Drawing Sheets

MULTI-LAYER BALUN TRANSFORMER

This application claims priority from U.S. Provisional Application Serial No. 60/377,056, filed Apr. 30, 2002, the entire content of which is incorporated herein by reference.

TECHNICAL FIELD

The invention relates to balun circuits and, more particularly, to multi-layer balun circuits for coupling between balanced and unbalanced lines or devices in an electronic system.

BACKGROUND

A balun is a device used for coupling an unbalanced line or device and a balanced line or device for the purpose of transforming signals from balanced to unbalanced or from unbalanced to balanced. In other words, the balun can be used to transform an unbalanced input signal to a pair of balanced output signals or, in the reverse situation, a pair of balanced input signals to an unbalanced output signal. The balun, for example, may interface an unbalanced input with a balanced circuit by dividing an input signal received at an unbalanced terminal equally between two balanced terminals and by providing a first output signal at one balanced terminal with a reference phase and a second output signal at the other balanced terminal with a 180-degree phase difference relative to the reference phase. Baluns are useful in a variety of circuits, and are widely used to couple transmitters or receivers to antennas for wireless communication.

SUMMARY

In general, the invention is directed to techniques for transforming unbalanced signals to balanced signals and balanced signals to unbalanced signals with a balun, and a balun for performing such techniques. The balun may be particularly useful for coupling an antenna to a transmitter or receiver in a wireless communication system.

In accordance with the invention, a balun may comprise a first unbalanced component and a second unbalaniced component that may be electrically coupled to form an unbalanced balun structure. The unbalanced components may, for example, be electrically coupled to one another by a conductive via. At least one of the unbalanced components is further coupled to an unbalanced port. The unbalanced port provides a coupling between the unbalanced components and an unbalanced device, such as an antenna. The unbalanced components may comprise conductive elements, such as conductive strips, disposed on a dielectric layer.

The balun may further include a balanced balun structure that includes a first balanced component and a second balanced component. Each balanced component electromagnetically couples more than one side of an associated unbalanced component. Each of the balanced components may comprise, for example, conductive strips disposed on a dielectric layer. For example, a balanced component may include a first conductive strip disposed on the dielectric layer adjacent to a first side of one of the unbalanced components, and a second conductive strip disposed on the dielectric layer adjacent to a second side of the unbalanced component. The conductive strips may be electrically coupled to one another to form the balanced component. In this manner, each balanced component electromagnetically couples more than one side of an associated unbalanced component. Each of the balanced components is coupled to a balanced port. The balanced port provides a coupling between the balun and a balanced device, such as receive and transmit circuitry of a transceiver.

The balun may be disposed on multiple layers, e.g., to conserve surface area. For example, the first unbalanced component and the first balanced component may be disposed on a first layer and the second unbalanced component and the second balanced component may be disposed on a second layer. The layers of the balun may be stacked on top of one another within a multi-layer circuit structure. Alternatively, one or more other intervening layers of the multi-layer circuit structure may be stacked between the layers of balun. In some embodiments, however, the balun may be formed on only a single layer. The balun may be formed by any of a variety of fabrication techniques including chemical vapor deposition, sputtering, etching, photolithography, masking, and the like.

In operation, the unbalanced components receive an unbalanced signal via the unbalanced port. The balun divides the received signal equally between the balanced ports. In particular, the electromagnetic coupling between the balanced components and the associated unbalanced components induces signals on the balanced components. The signals induced on the balanced components are transmitted to a balanced device via the balanced ports.

The signals output on each of the balanced ports are identical except for an approximate 180-degree phase shift. For example, the signal output from one of the balanced ports may have a first phase and the signal output from the other balanced port may have a second phase that is approximately 180-degrees out of phase relative to the phase of the signal output from first balanced port. Signal flow also may occur in the opposite direction. The balanced components may receive balanced signals from corresponding balanced ports, which may be coupled to transmit circuitry of a transceiver or transmitter. The electromagnetic coupling between the balanced components and the unbalanced components induces a signal on the unbalanced components. The signals on the unbalanced components are combined and output via the unbalanced port.

In one embodiment, the invention provides a balun comprising an unbalanced balun structure having a first unbalanced component and a second unbalanced component electrically coupled to one another and a balanced balun structure having a first balanced component and a second balanced component. The first balanced component electromagnetically couples more than one side of the first unbalanced component and the second balanced component electromagnetically couples more than one side of the second unbalanced component.

In another embodiment, the invention provides a method comprising forming a first unbalanced component, forming a first balanced component in an orientation for electromagnetic coupling with more than one side of the first unbalanced component, electrically coupling the first balanced component to a first balanced port, forming a second unbalanced component, electrically coupling the first and second unbalanced components, forming a second balanced component in an orientation for electromagnetic coupling with more than one side of the second unbalanced component, and electrically coupling the second balanced component to a second balanced port.

In a further embodiment, the invention provides a balun comprising a first unbalanced conductive element disposed on a first layer, a first balanced conductive element disposed on the first layer and oriented for electromagnetic coupling with a first side of the first unbalanced conductive element, a second balanced conductive element disposed on the first layer and oriented for electromagnetic coupling with a second side of the first unbalanced conductive element, wherein the first and second balanced conductive elements are electrically coupled to a first balanced port, a second unbalanced conductive element disposed on a second layer, wherein the first and second unbalanced conductive elements are electrically coupled, a third balanced conductive element disposed on the second layer and oriented for electromagnetic coupling with a first side of the second unbalanced conductive element, and a fourth balanced conductive element disposed on the second layer and oriented for electromagnetic coupling with a second side of the second unbalanced conductive element, wherein the third and fourth balanced conductive elements are electrically coupled to a second balanced port.

In an additional embodiment, the invention provides an apparatus comprising an unbalanced balun component and a balanced balun component that includes a first balanced element and a second balanced element disposed on opposite sides of the unbalanced component.

The invention may provide one or more advantages. Forming the balun on multiple layers can reduce cross talk between the unbalanced components of the balun. Further, forming the balun on multiple layers may reduce the amount of planar space needed for the balun. Further, the configuration of the balun significantly reduces the insertion loss of the balun. In particular, a balanced component can be formed to electromagnetically couple two or more sides of the unbalanced component. The configuration of the balun also allows the balun to be manufactured in low-temperature co-fired substrates and high temperature co-fired substrates having balanced component to unbalanced component spacing that is smaller than balanced component to unbalanced component spacing normally achieved in other types of manufacturing, such as printed circuit board manufacturing. However, printed circuit board manufacturing techniques may be used to construct the balun. Also, a length and width of the unbalanced and balanced components may be adjusted to achieve a desired impedance transformation in addition to conversion between balanced and unbalanced signals. Further, because the unbalanced components of the balun are electromagnetically coupled on more than one side, the amount of energy lost from the signal during electromagnetic coupling is reduced.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
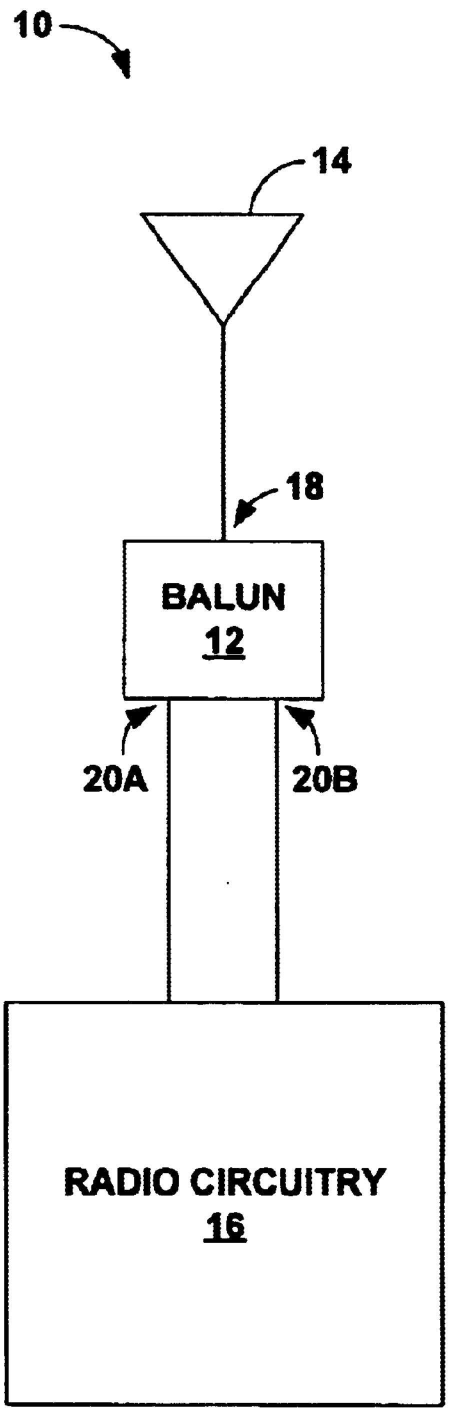
FIG. 1 is a block diagram illustrating a system that includes a balun for coupling unbalanced devices to balanced devices.

FIG. 1 is a block diagram illustrating a system 10 that includes a balun 12 for coupling unbalanced devices to balanced devices. Balun 12 can be used, for example, between various parts of a wireless or cable communications system. As will be described, balun 12 may include a pair of unbalanced balun components coupled to one another. Balun 12 further may include balanced balun components associated with the unbalanced balun components. Each balanced balun component electromagnetically couples more than one side of an associated unbalanced balun component. The balanced balun components may be referred to as "edge-coupled" because the balanced balun components are substantially aligned adjacent to edges of the unbalanced balun components, resulting in electromagnetic coupling between balanced and unbalanced components. Further, balun 12 may be formed on multiple layers of a multi-layer circuit structure.

In the example of FIG. 1, a balun 12 couples an antenna 14 to radio circuitry 16. More specifically, balun 12 receives an unbalanced signal from antenna 14 via an unbalanced port 18 and divides the received signal equally between two balanced ports 20A and 20B ("20"). Each of balanced ports 20 outputs signals that are identical except for a 180-degree phase shift. For example, balun 12 may output a first signal from balanced port 20A with a first phase and a second signal from balanced port 20B with a second phase that is approximately 180-degrees out of phase relative to the phase of the first signal output from balanced port 20A. The signals output via balanced ports 20 are fed to receive circuitry within radio circuitry 16.

Signal flow may also occur in the opposite direction. Balun 12 may receive a differential signal, i.e., a pair of balanced signals, from transmit circuitry within radio circuitry 16 via balanced ports 20. Balun 12 combines the balanced signals to create an unbalanced signal and outputs the unbalanced signal to antenna 14 via unbalanced port 18.

The diagram of FIG. 1 should be taken as exemplary of a type of device that balun 12 may couple, however, and not as limiting of the invention as broadly embodied herein. Balun 12 may be used to couple various other unbalanced and balanced devices. For instance, balun 12 may be used for construction of balanced amplifiers, mixers, voltage controlled oscillators, antenna systems, and the like.

Figure 2:
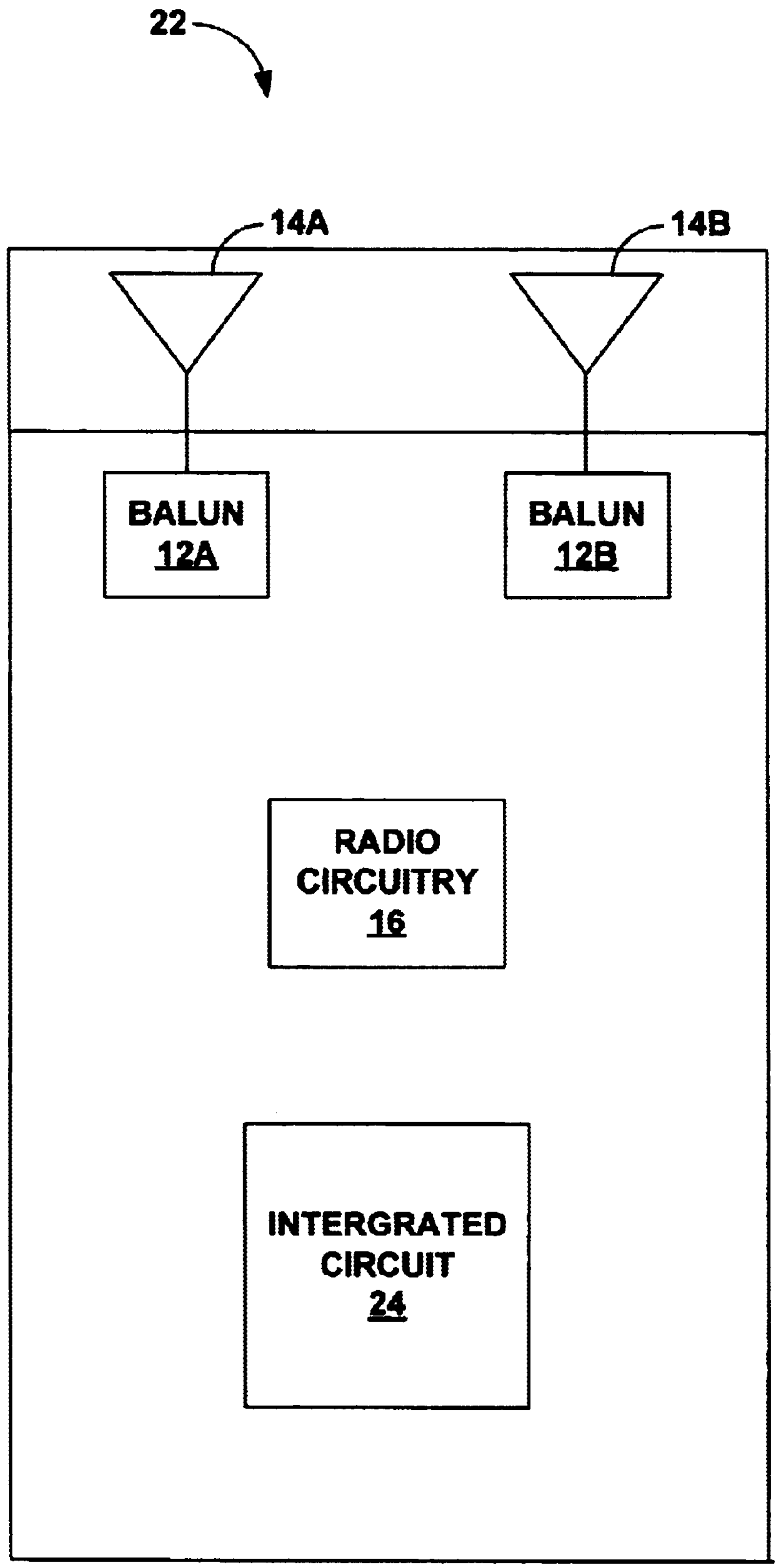
FIG. 2 is a block diagram of a wireless card for wireless commnunication.

FIG. 2 is a block diagram of a wireless card 22 for wireless communication. Wireless card 22 includes antennas 14A and 14B ("14"), baluns 12A and 12B ("12"), radio circuitry 16, and an integrated circuit 24. Antennas 14 receive and transmit signals to and from wireless card 22. Antennas 14 may, for example, receive signals over multiple receive paths providing wireless card 22 with receive diversity. In this manner, antenna 14A provides a first receive path, and antenna 14B provides a second receive path. Wireless card 22 may select, via radio circuitry 16, the receive path with the strongest signal. Altematively, wireless card 22 and, more particularly, radio circuitry 16 may combine the signals from the two receive paths. More than two antennas 14 may be provided in some embodiments for enhanced receive diversity. Alternatively, only a single antenna 14 may be provided in which case wireless card 22 does not make use of receive diversity. One or both of antennas 14 may further be used for transmission of signals from wireless card 22.

Radio circuitry 16 may include transmit and receive circuitry (not shown). For example, radio circuitry 16 may include circuitry for upconverting transmitted signals to radio frequency (RF), and downconverting RF signals to a baseband frequency for processing by integrated circuit 24. In this sense, radio circuitry 16 may integrate both transmit and receive circuitry within a single transceiver component. In some cases, however, transmit and receive circuitry may be formed by separate transmitter and receiver components.

Baluns 12 couple antennas 14, i.e., an unbalanced structure, with radio circuitry 16, i.e., a balanced structure. As described above, baluns 12 transform unbalanced signals from antennas 14 to balanced signals for radio circuitry 16 and vice versa, i.e., differential (balanced) signals from radio circuitry 16 to unbalanced signals for antennas 14.

Integrated circuit 24 processes inbound and outbound signals. Integrated circuit 24 may, for instance, encode information in a baseband signal for upconversion to the RF band or decode information from RF signals received via antennas 14. For example, integrated circuit 24 may provide Fourier transform processing to demodulate signals received from a wireless communication network.

The diagrams of FIG. 2 should be taken as exemplary of the type of device in which the invention may be embodied, however, and not as limiting of the invention as broadly embodied herein. For example, the invention may be practiced in a wide variety of devices, including RF chips, cellular phones, personal computers (PCs), personal digital assistants (PDAs), and the like. In addition, the invention may be practiced in devices that do not provide communication, but simply transform signals from balanced (or differential) to unbalanced and vice versa. As a particular example, wireless card 22 may take the form of a wireless local area networking (WLAN) card that conforms to a WLAN standard such as one or more of the IEEE 802.11(a), 802.11(b) or 802.11(g) standards.

Figure 3:
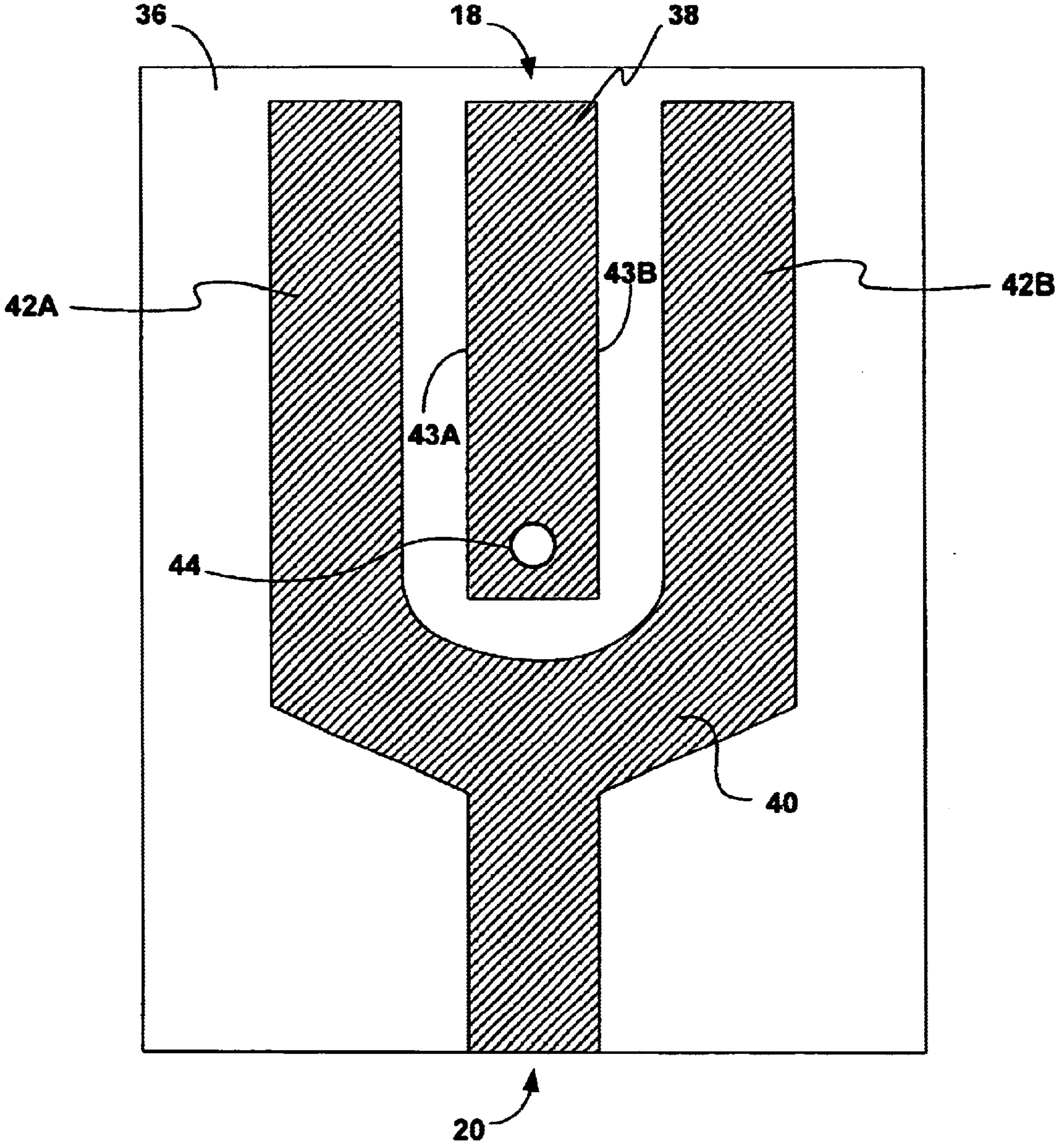
FIG. 3 is a perspective view of a portion of a balun.

FIG. 3 is a plan view of a portion of balun 12. The portion of balun 12 illustrated in FIG. 3 includes an unbalanced component 38 of an unbalanced balun structure disposed on a dielectric layer 36. Dielectric layer 36 may form a layer in a multi-layer circuit structure. The portion of balun 12 further includes a balanced component 40 of a balanced balun structure disposed on dielectric layer 36. Balanced balun component 40 electromagnetically couples more than one side of unbalanced component 38. More particularly, balanced component 40 includes balanced elements 42A, 42B substantially aligned adjacent to opposite edges 43A, 43B of the unbalanced component 38. This arrangement results in electromagnetic coupling between balanced component 40 and more than one side of unbalanced component 38. Electromagnetically coupling to more than one side of unbalanced component 38 allows more energy radiated from unbalanced component 38 to be coupled to balanced component 40, resulting in reduction of energy loss and greater energy efficiency.

Unbalanced component 38 may be electrically connected to a second unbalanced component (not shown in FIG. 3). The second unbalanced component may be formed on dielectric layer 36 along with unbalanced component 38. Alternatively, the second unbalanced component may be formed on a different dielectric layer, which may be vertically aligned with dielectric layer 36. For example, unbalanced component 38 may be electrically connected to the second unbalanced component with a conductive via 41 that extends between the unbalanced components and any dielectric layers or other layers between the unbalanced components.

Further, unbalanced component 38 may be coupled to an unbalanced port 18. Unbalanced port 18 may provide a coupling between unbalanced component 38 of balun 12 and an unbalanced circuit or device, such as antenna 14.

Balanced component 40 may comprise balanced elements 42A and 42B, such as conductive strips, that are electrically coupled to form balanced component 40. For instance, balanced element 42A may be disposed on dielectric layer 36 adjacent to a first side of unbalanced component 38 and balanced element 42B may be disposed on dielectric layer 36 adjacent to a second side of the unbalanced component 38. Balanced elements 42 may be electrically coupled at one end to form balanced component 40. In this manner, balanced component 40 electromagnetically couples more than one side of unbalanced component 38.

Unbalanced component 38, which may also be a conductive strip, and balanced elements 42 may be of a length approximately equal to approximately a quarter of a wavelength of an operating frequency. Further, the length and width of unbalanced component 38 and balanced elements 42 may be adjusted to achieve an impedance transformation in addition to conversion between balanced and unbalanced signals.

Balanced component 40 is coupled to a balanced port 20. Balanced port 20 may provide a coupling between balanced component 40 of balun 12 and a balanced circuit or device, such as radio circuitry 16.

Unbalanced component 38 and balanced component 40 may be formed by any of a variety of fabrication techniques. For instance, a conductive layer (not shown) may be deposited on dielectric layer 36 and shaped, e.g., by etching, to form unbalanced component 38 and balanced component 40. More specifically, the conductive layer may be deposited on dielectric layer 36 using techniques such as chemical vapor deposition and sputtering. The conductive layer deposited on dielectric layer 36 may be shaped via etching, photolithography, masking, or a similar technique to form unbalanced component 38 and balanced component 40. Alternatively, printing techniques may be used to deposit conductive traces on dielectric layer 36. The conductive layer may include copper, aluminum, or other conductive material. Dielectric layer 36 may include a dielectric material such as silicon oxide or other such material.

Figure 4:
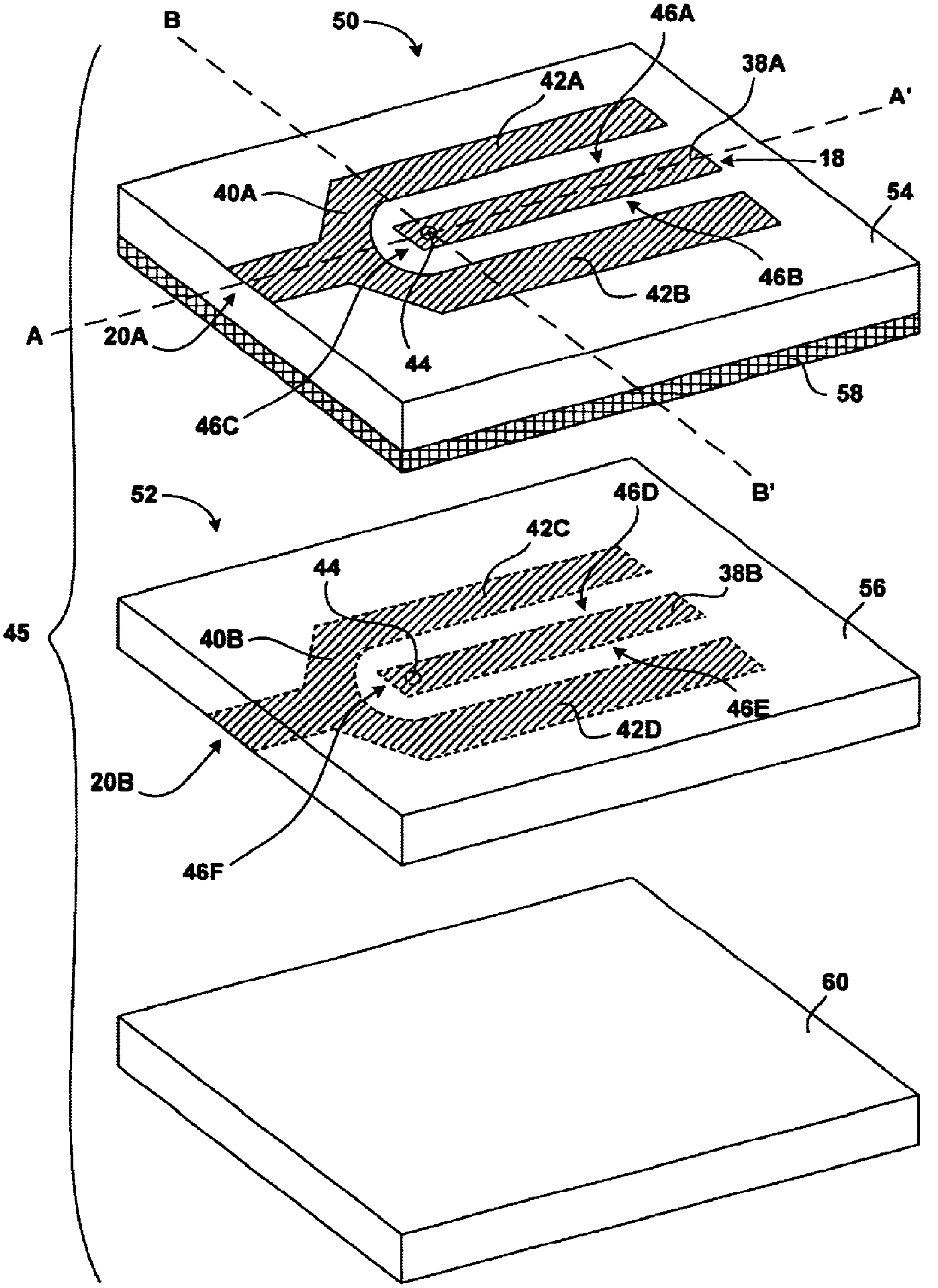
FIG. 4 is an exploded view of an exemplary balun formed multiple layers.

FIG. 4 is an exploded view of an exemplary balun 45 having components formed on more than one layer of a multi-layer circuit structure. As shown in FIG. 4, balun 45 comprises unbalanced components 38A and 38B ("38") that may be electrically coupled to form an unbalanced balun structure. Unbalanced components 38 may, for example, be electrically coupled by a conductive via 44 that extends between multiple layers of a multilayer circuit structure. At least one of unbalanced components 38 is further coupled to an unbalanced port 18. In the example illustrated in FIG. 4, unbalanced component 38A is coupled to unbalanced port 18. In some cases, however, unbalanced component 38B may be coupled to unbalanced port 18. In some embodiments, unbalanced components 38 may not be electrically coupled to one another. In this case, both unbalanced components 38 are coupled to unbalanced port 18. Unbalanced components 38 may be conductive elements, such as conductive strips disposed on a dielectric layer.

Balun 45 further includes a balanced balun structure that includes balanced components 40A and 40B ("40"). Each of balanced components 40 is electromagnetically coupled to one of unbalanced components 38. Each balanced component 40 couples more than one side 46A–46F ("46") of a corresponding unbalanced component 38. For example, as illustrated in FIG. 4, balanced component 40A electromagnetically couples sides 46A–46C of unbalanced component 38A and balanced component 40B electromagnetically couples sides 46D–46F of unbalanced component 38B.

Balanced components 40 may be constructed of balanced elements, such as balanced elements 42A–42D ("42"). For instance, balanced element 42A may be disposed on dielectric layer 36 adjacent to a first side of unbalanced component 38 and balanced element 42B may be disposed on dielectric layer 36 adjacent to a second side of the unbalanced component 38. Balanced elements 42 may be electrically coupled at one end to form balanced component 40. In this manner, balanced component 40 electromagnetically couples more than one side of unbalanced component 38.

Unbalanced component 38, which may also be a conductive strip, and balanced elements 42 may be of a length equal to approximately a quarter of a wavelength of an operating frequency. Further, the length and width of balanced elements 42 may be adjusted to achieve a desired impedance transformation between the balanced and unbalanced inputs.

Each of balanced components 40 is coupled to a balanced port 20. More specifically, balanced component 40A is coupled to balanced port 20A and balanced component 40B is coupled to balanced port 20B.

In the example illustrated in FIG. 4, balun 45 is disposed on layers 50 and 52. Although balun 45 is described as being disposed on two layers, in some embodiments balun 45 may be disposed on more than two layers or only a single layer. Layer 50 of balun 45 includes unbalanced component 38A and balanced component 40A disposed on a dielectric layer 54. Unbalanced component 38A and balanced component 40A may be formed by any of a variety of fabrication techniques. For example, a conductive layer may be deposited on a top side of dielectric layer 54 and etched to form unbalanced component 38A and balanced component 40A.

Layer 52 of balun 45 includes unbalanced component 38B and balanced component 40B disposed on a bottom side of a dielectric layer 56 in order to isolate unbalanced and balanced components 38B and 40B from a ground plane 58. Unbalanced component 38B and balanced component 40B may be formed by fabrication techniques similar to those used for unbalanced component 38A and balanced component 40A.

Alternatively, unbalanced and balanced component 38B and 40B may be disposed on a top portion of a dielectric layer 60 and dielectric layer 56 may be used to isolate unbalanced and balanced components 38B and 40B from ground plane 58. Although in the embodiment shown in FIG. 4 unbalanced and balanced components 38A and 40A are disposed on a different dielectric layer than unbalanced and balanced components 38B and 40B, this does not have to be the case. For example, unbalanced and balanced components 38A and 40A may be disposed on an opposing side of the same dielectric layer as unbalanced and balanced components 38B and 40B.

As illustrated in FIG. 4, layers 50 and 52 may be oriented such that unbalanced component 38A is parallel with unbalanced component 38B. However, layers 50 and 52 may be oriented in any fashion. For example, layers 50 and 52 may be oriented such that unbalanced component 38A is perpendicular to unbalanced component 38B. Further, layers 50 and 52 may be oriented such that unbalanced balun component 38A substantially vertically aligns with unbalanced component 38B.

A conductive ground plane 58 may be placed between layers 50 and 52. Balanced components 40 of the balanced balun structure may be referenced to ground plane 58, i.e., carry a potential relative to ground plane 58. Conductive via 44 extends between unbalanced component 38A and unbalanced component 38B, i.e., through dielectric layer 54, dielectric layer 56, and ground plane 58, to electrically couple unbalanced components 38. Another dielectric layer 60 may be placed below layer 52. Although in FIG. 4 only ground plane 58 separates layers 50 and 52, any number of planes or layers may separate layers 50 and 52.

Balun 45 couples an unbalanced line or device with a balanced line or device. Balun 45 and, more particularly, unbalanced components 38 receive an unbalanced signal via unbalanced port 18. Balun 45 divides the received signal equally between balanced ports 20. More specifically, electromagnetic coupling between balanced components 40 and associated unbalanced components 38 induces signals on balanced components 40. For instance, an electromagnetic field from unbalanced component 38A radiates in all directions. Balanced component 40A, which electromagnetically couples more than one side 46 of unbalanced component 38A, induces a signal due to the electromagnetic coupling and transmits the signal via balanced port 20A. Electromagnetically coupling more than one side of unbalanced component 38A allows more energy radiated from unbalanced component 38 to be coupled to balanced component 40A, resulting in reduction of energy loss and greater energy efficiency. A similar phenomenon occurs for unbalanced component 38B, balanced component 40B, and balanced port 20B. The signals output on each of balanced ports 20 are identical except for an approximate 180-degree phase shift. For example, the signal output from balanced port 20A may have a first phase and the signal output from balanced port 20B may have a second phase that is a 180-degrees out of phase relative to the phase of the signal output from balanced port 20A. The signals output via balanced ports 20 are fed to a balanced device, such as receive circuitry of radio circuitry 16.

Signal flow also occurs in the opposite direction. Balanced components 40 each receive a balanced signal from a balanced device via corresponding balanced ports 20. Balun 45 combines the balanced signals to create an unbalanced signal and outputs the unbalanced signal to an unbalanced device, such as antenna 14, via unbalanced port 18. More particularly, electromagnetic coupling between balanced components 40 and corresponding unbalanced components 38 induce a signal on each of unbalanced components 38. The signals induced on each of unbalanced components 38 combine via the electric coupling between unbalanced components 38 and are output via unbalanced port 18.

Figure 5:
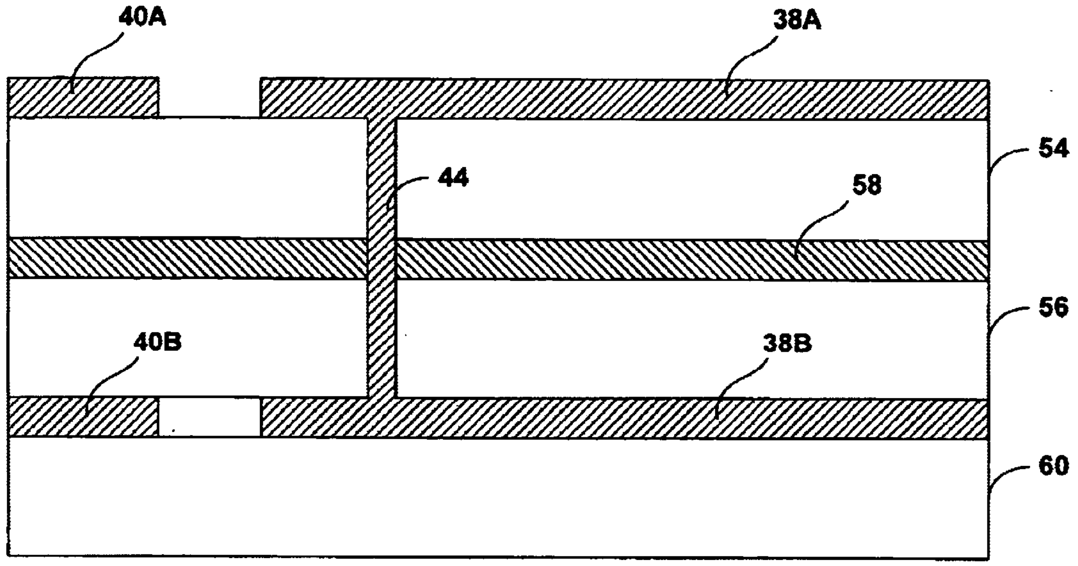
FIG. 5 is a schematic diagram illustrating a cross section view of the balun of FIG. 4

FIG. 5 is a schematic diagram illustrating a cross section view of balun 45 of FIG. 4 from A to A'. Unbalanced components 38A and 38B of balun 45 are electrically coupled by a conductive via 44. As illustrated in FIG. 5, conductive via 44 extends between unbalanced component 38A and unbalanced component 38B through a first dielectric layer 54, a ground plane 58, and a second dielectric layer 56.

Unbalanced component 38A and a balanced component 40A are disposed on a top portion of dielectric layer 54.

Unbalanced component 38B and balanced component 40B may be disposed on a bottom portion of dielectric layer 56. Alternatively, unbalanced component 38B and balanced component 40B may be disposed on a top portion of dielectric layer 60. As described above, unbalanced components 38 and balanced components 40 may be disposed on the corresponding dielectric layers by any of a variety of fabrication techniques.

Balanced components 40 may be referenced to a common ground plane 58, i.e., carry a potential relative to ground plane 58. Alternatively, each of balanced components 40 may be referenced to separate ground planes.

In the example of FIG. 5, unbalanced component 38A and unbalanced component 38B are oriented such that unbalanced components 38 are parallel with respect to one another. However, unbalanced components 38 may be oriented with respect to one another in any manner. For instance, unbalanced components 38 may be oriented such that unbalanced component 38A is perpendicular to unbalanced component 38B.

The multi-layer structure of balun 45 may be dispersed anywhere throughout a multi-layer circuit structure. For example, the layers of balun 45 may stack concurrently on top of one another within the multi-layer circuit structure. Alternatively, one or more other layers of the multi-layer circuit structure may stack between the layers of balun 45. For example, a power plane and another dielectric layer may be stacked between dielectric 54 and ground plane 58.

Figure 6:
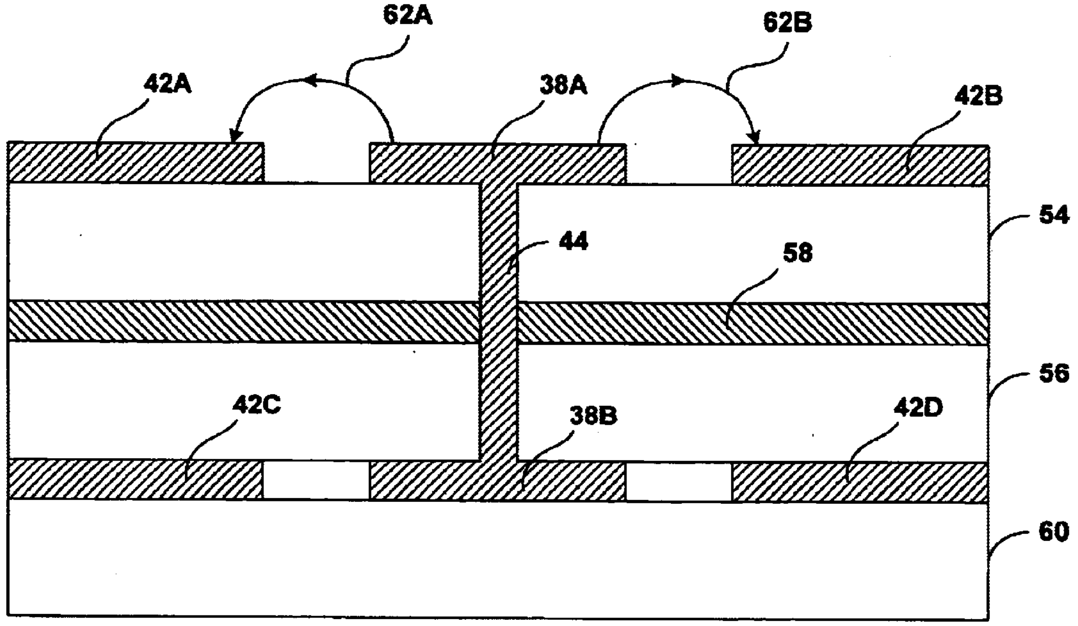
FIG. 6 is a schematic diagram illustrating another cross section view of the balun of FIG. 4

FIG. 6 is a schematic diagram illustrating another cross-sectional view of balun 45 of FIG. 4 from B to B'. Unbalanced components 38A and 38B of balun 45 are electrically coupled by a conductive via 44. As illustrated in FIG. 5, conductive via 44 extends between unbalanced component 38A and unbalanced component 38B through a first dielectric layer 54, a ground plane 58, and a second dielectric layer 56.

Unbalanced component 38A and balanced elements 42A and 42B are disposed on a top portion of dielectric layer 54. Balanced elements 42A and 42B are disposed adjacent to unbalanced component 38A to electromagnetically couple more than one side of unbalanced component 38A, as is illustrated by arrows 62A and 62B. Unbalanced component 38B and balanced elements 42C and 42D may be disposed on a bottom portion of dielectric layer 56.

Alternatively, unbalanced component 38B and balanced elements 42C and 42D may be disposed on a top portion of dielectric layer 60. Balanced elements 42C and 42D are disposed adjacent to unbalanced component 38B to electromagnetically couple more than one side of unbalanced component 38B. As described above, unbalanced components 38 and balanced elements 42 may be disposed on the corresponding dielectric layers by any of a variety of fabrication techniques.

Figure 7:
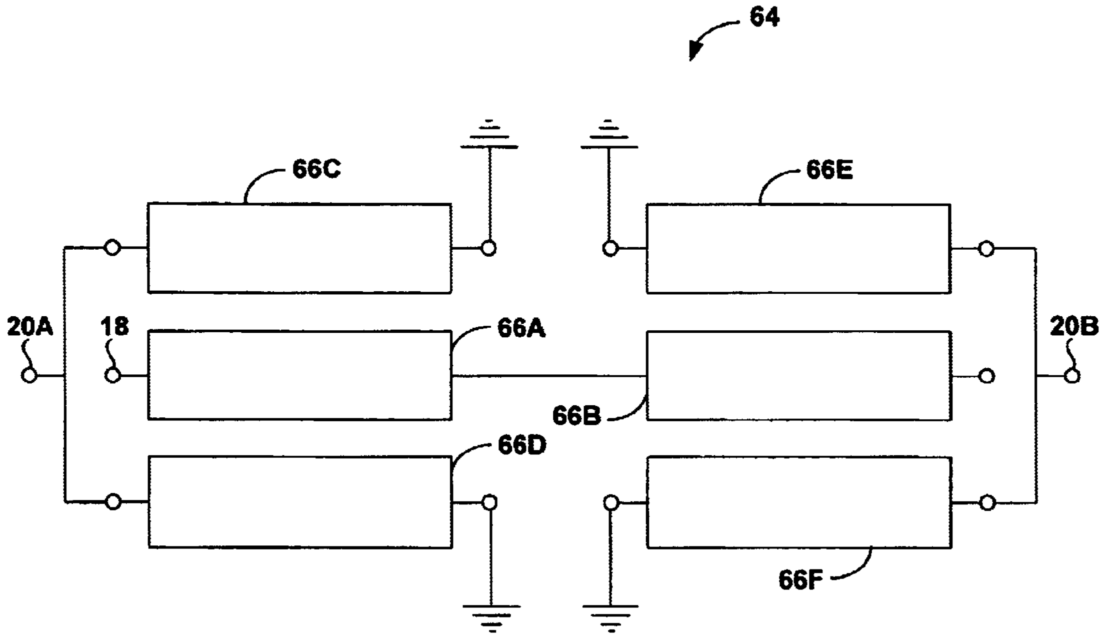
FIG. 7 is a block diagram illustrating an equivalent circuit of the balun of FIGS. 4–6.

FIG. 7 is a block diagram illustrating an equivalent circuit 64 corresponding to balun 45 of FIG. 4–6. Equivalent circuit 64 includes circuit elements 66A–66F ("66"), which correspond to unbalanced components 38 and balanced elements 42. As illustrated in FIG. 7, circuit element 66A and circuit element 66B, corresponding to unbalanced elements 38A and 38B, respectively, are electrically connected. Circuit element 66A further couples an unbalanced port 18. Alternatively, circuit element 66B may couple unbalanced port 18.

Circuit elements 66C and 66D, corresponding to balanced elements 42A and 42B, respectively, are electrically coupled to form balanced component 40A. Circuit element 66C electromagnetically couples a first side of circuit element 66A and circuit element 66D electromagnetically couples a second side of circuit element 66A. Electrically coupled circuit elements 66C and 66D further couple to a first balanced port 20A.

Circuit elements 66E and 66F, corresponding to balanced elements 42C and 42D, respectively, are electrically coupled to form balanced component 40B. Circuit element 66E electromagnetically couples a first side of circuit element 66B and circuit element 66F electromagnetically couples a second side of circuit element 66B. Electrically coupled circuit elements 66E and 66F further couple to a first balanced port 20B.

Circuit elements 66C–66F are referenced to a ground plane. Circuit elements 66C–66F may be referenced to a common ground plane. Alternatively, circuit elements 66C–66F may be referenced to different ground planes.

Figure 8:
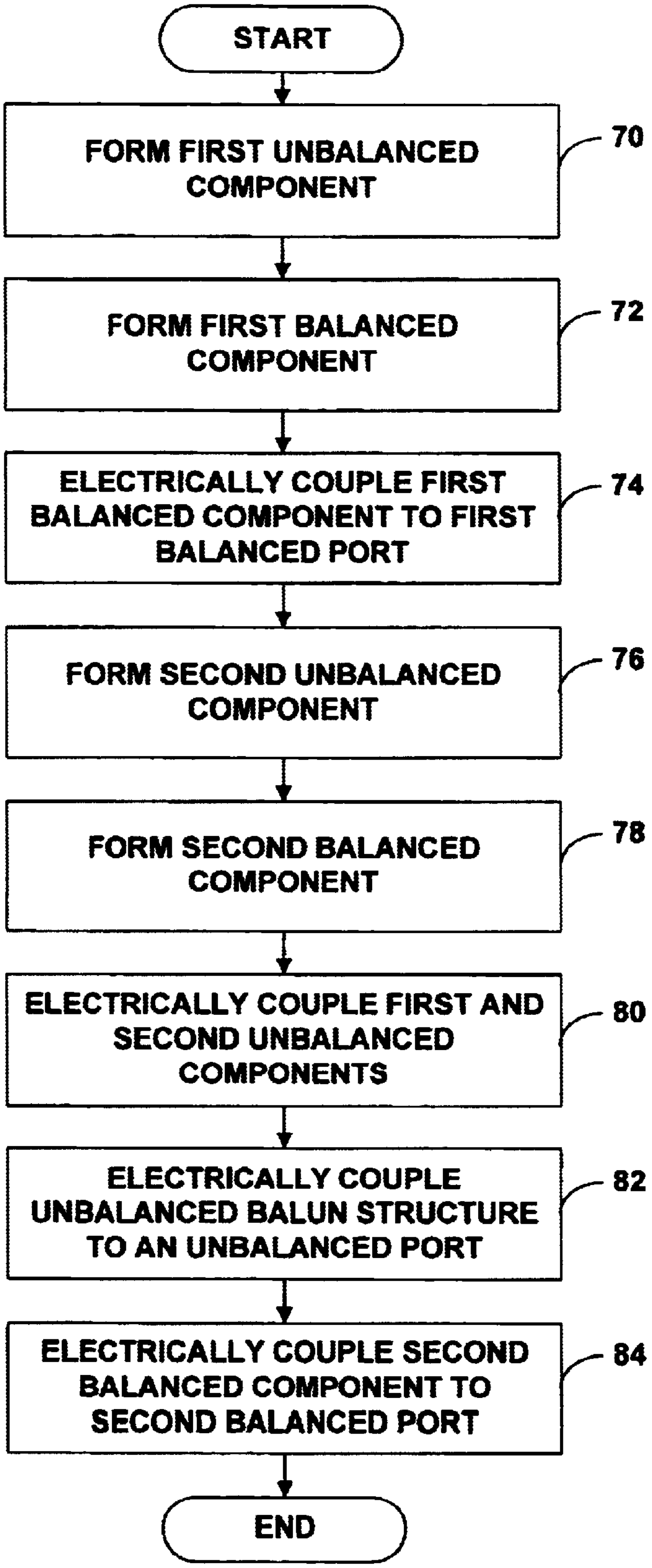
FIG. 8 is a flow diagram illustrating a process for creating a balun.

FIG. 8 is a flow diagram illustrating a process for creating balun 12. A first unbalanced component and a first balanced component are formed (70, 72). For example, a first unbalanced conductive element, such as a conductive strip, may be formed on a dielectric layer, e.g., by deposition or etching, to form the unbalanced component. A first balanced conductive element may be disposed adjacent a side of the unbalanced conductive element. A second balanced conductive element may be disposed adjacent an opposing side of the unbalanced conductive element and electrically coupled to the first balanced conductive element to form the balanced component. The first balanced component is electrically coupled to a first balanced port (74).

Unbalanced component and balanced component may be formed using various fabrication techniques. A conductive layer, such as copper, aluminum, or other conductive material, may be deposited, for instance, on a dielectric layer. The conductive layer may be deposited on the dielectric layer via chemical vapor deposition, sputtering, or any other depositing technique. The conductive layer may be shaped via etching, photolithography, masking, or similar technique to form the first unbalanced and balanced components.

A second unbalanced component and a second balanced component are formed (76, 78). The second unbalanced and balanced components may be formed by disposing conductive elements on a dielectric layer as described above. The second unbalanced and balanced components may be formed using techniques similar to the techniques described above. The second unbalanced and balanced components may be formed on a different dielectric layer than the first unbalanced and balanced components. Alternatively, the second unbalanced and balanced components may be formed on the same dielectric layer as the first unbalanced and balanced components.

The first unbalanced component and the second unbalanced component are electrically coupled to form an unbalanced balun structure (80). For the case in which the first and second unbalanced components reside on different layers, a conductive via may extend between the first and second unbalanced components. For the case in which the first and second unbalanced components reside on the same layer, a conductive strip may couple the unbalanced components.

The unbalanced balun structure is electrically coupled to an unbalanced port (82). The unbalanced balun structure may be electrically coupled to the unbalanced port via an electrical coupling between one or both of the unbalanced components and the unbalanced port. Further, the second balanced component is electrically coupled to a second balanced port (84).

Forming balun 12 on multiple layers may eliminate or reduce cross talk between the unbalanced components of balun 12. Further, the configuration of balun 12 significantly may reduce the insertion loss of balun 12,.promoting electromagnetic coupling efficiency. The configuration of balun 12 also may allow balun 12 to be manufactured in low-temperature co-fired substrates and high temperature co-fired substrates having balanced component to unbalanced component spacing that is smaller than balanced component to unbalanced component spacing normally achieved in other types of manufacturing.

Figure 9:
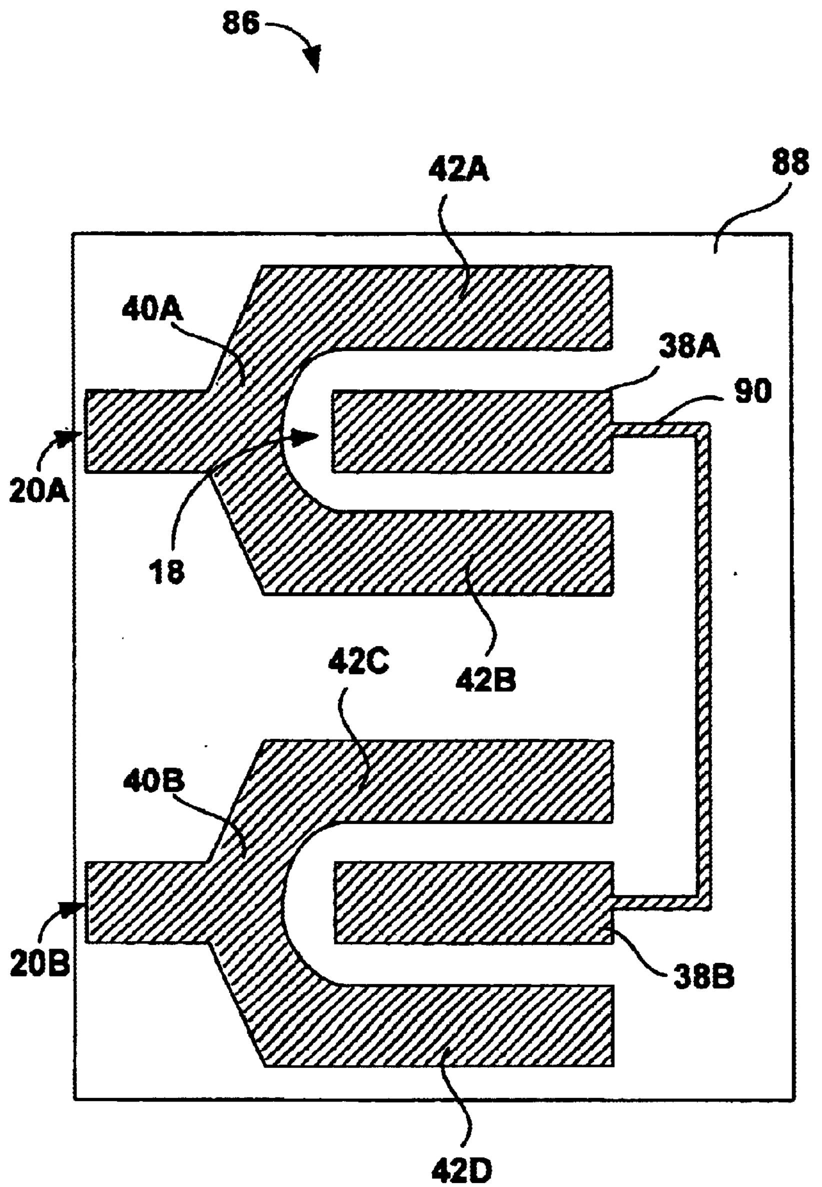
FIG. 9 is a block diagram illustrating a balun arranged on a single layer.

FIG. 9 is a block diagram illustrating a balun 86 arranged on a single layer 88. Balun 86 includes unbalanced components 38A and 38B ("38") that are electrically coupled to form an unbalanced balun structure. Unbalanced components may be electrically coupled via a conductive strip 90 that extends from unbalanced component 38A to unbalanced component 38B.

Balun 86 further comprises a balanced balun structure that includes balanced components 40A and 40B ("40"). Balanced components 40 electromagnetically couple respective unbalanced components 38. More specifically, balanced component 40A electromagnetically couples more than one side of unbalanced balun component 38A and balanced component 40B electromagnetically couples more than one side of unbalanced balun component 38B.

Balanced components 40 may be constructed of balanced elements, such as balanced elements 42A–42D ("42"). For example, balanced component 40A may consist of a first balanced element 42A that electromagnetically couples a first side of unbalanced component 38A and a second balanced element 42B that electromagnetically couples a. second side of unbalanced component 38A. Balanced elements 42A and 42B are electrically coupled to form balanced component 40A. Balanced component 42B may be constructed in a similar fashion using balanced elements 42C and 42D.

Each of balanced components 40 is coupled to a balanced port 20. More specifically, balanced component 40A is coupled to balanced port 20A and balanced component 40B is coupled to balanced port 20B. The unbalanced balun structure is coupled to an unbalanced port 18. More specifically, one or both of unbalanced components 38 is connected to unbalanced port 18.

Figure 10:
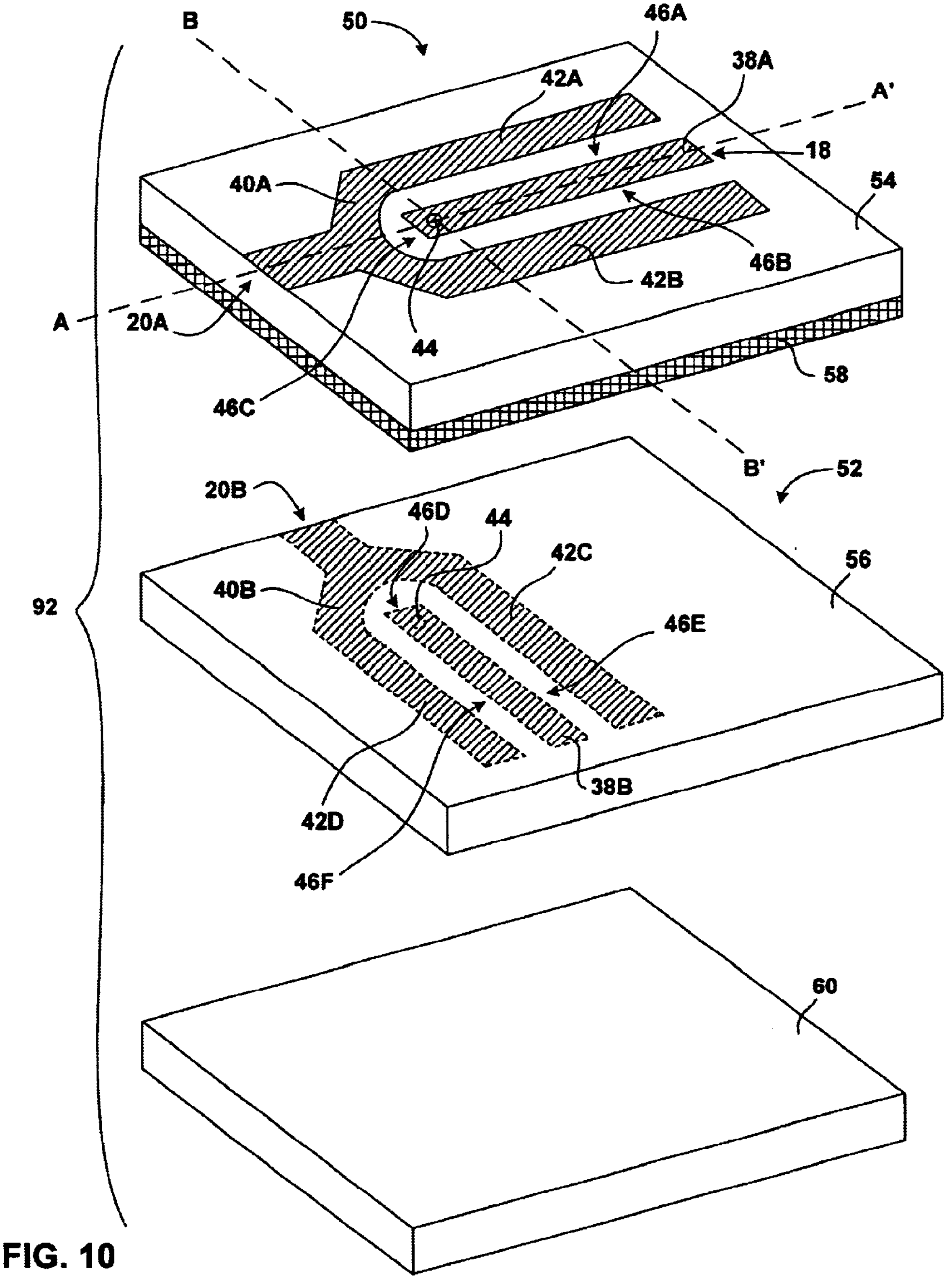
FIG. 10 is an exploded veiw of another exemplary balun formed on multiple layers.

FIG. 10 is an exploded view of an exemplary balun 92 having components formed on more than one layer of a multiple-layer circuit structure. Balun 92 conforms substantially to balun 45 of FIG. 4, but layers 50 and 52 are oriented such that unbalanced component 38A is perpendicular to unbalanced component 38B.

Various embodiments of the invention have been described. These and other embodiments are within the scope of the following claims.

What is claimed is:

1. A balun comprising:

an unbalanced balun structure having a first unbalanced component and a second unbalanced component electrically coupled to one another, and a balanced balun structure having a first balanced component and a second balanced component, wherein the first balanced component electromagnetically couples more than one side of the first unbalanced component, and the second balanced component electromagnetically couples more than one side of the second unbalanced component, and further wherein the first unbalanced component and the first balanced component are disposed on a first layer of a multi-layer circuit structure, and the second unbalanced component and the second balanced component are disposed on a second laser of the multi-layer circuit structure.

2. The balun of claim 1, wherein the first layer includes a first dielectric layer and the second layer includes a second dielectric layer.

3. The balun of claim 1, wherein one or more intermediate layers separate the first and second layers.

4. The balun of claim 1, wherein a ground plane separates the first and second layers.

5. The balun of claim 1, wherein the first unbalanced component and the first balanced component are disposed on a first side of a dielectric layer, and the second unbalanced component and the second balanced component are disposed on a second side of the dielectric layer.

6. The balun of claim 1, wherein the first and second unbalanced components are electrically coupled by a conductive via.

7. The balun of claim 1, wherein at least one of the first and second unbalanced components is coupled to an unbalanced port.

8. The balun of claim 1, wherein the first balanced component is coupled to a first balanced port and the second balanced component is coupled to a second balanced port.

9. The balun of claim 1, wherein the first and second balanced components include:

a first balanced element that electromagnetically couples a first side of the unbalanced component; and a second balanced element that electromagnetically couples a second side of the unbalanced component, wherein the first balanced element and the second balanced element are electrically coupled.

10. The balun of claim 9, wherein the first and second balanced elements comprise conductive strips.

11. The balun of claim 1, wherein the first and second unbalanced components are oriented such that the first unbalanced component is parallel with the second unbalanced component.

12. The balun of claim 1, wherein the first and second unbalanced components are oriented such that the first unbalanced component is perpendicular to the second balanced component.

13. The balun of claim 1, wherein the first and second balanced components of the balanced balun structure carry a potential relative to a ground plane.

14. The balun of claim 1, wherein a length of the first and second unbalanced components is approximately a quarter of a wavelength of an operating frequency.

15. The balun of claim 14, wherein a length of the first and second balanced components is approximately a quarter of a wavelength of the operating frequency.

16. The balun of claim 1, wherein the first and second unbalanced components comprise conductive strips.

17. The balun of claim 18, wherein the conductive strips are deposited on a dielectric layer.

18. A method comprising:

forming a first unbalanced component;

forming a first balanced component in an orientation for electromagnetic coupling with more than one side of the first unbalanced component wherein the first unbalanced component and first balanced component are formed on a first layer of a multi-layer circuit structure;

electrically coupling the first balanced component to a first balanced port;

forming a second unbalanced component;

electrically coupling the first and second unbalanced components;

forming a second balanced component in an orientation for electromagnetic coupling with more than one side of the second unbalanced component, wherein the second unbalanced component and second balanced component are formned on a second layer of the multi-layer circuit structure; and electrically coupling the second balanced component to a seed balanced port.

19. The method of claim 18, wherein forming the unbalanced and balanced components includes:

depositing a conductive layer on a dielectric layer, and shaping the conductive layer to form the unbalanced and balanced components.

20. The method of claim 19, wherein the technique for depositing the conductive layer on the dielectric layer includes at least one of chemical vapor deposition and sputtering.

21. The method of claim 19, wherein shaping the conductive layer includes shaping the conductive layer via at least one of etching, photolithography, and masking.

22. The method of claim 18, further comprising forming one or more layers between the fast layer and the second layer.

23. The method of claim 18, further comprising forming a ground plane between the first layer and the second layer.

24. The method of claim 18, further comprising:

forming the first unbalanced component and the first balanced component on a first side of a dielectric layer; and forming the second unbalanced component and the second balanced component on a second side of the dielectric layer.

25. The method of claim 18, wherein electrically coupling the first and second unbalanced components includes electrically coupling the first and second unbalanced components by a conductive via.

26. The method of claim 18, further comprising electrically coupling at least one of the first and second unbalanced components to an unbalanced port.

27. The method of claim 18, wherein forming the first and second balanced components includes:

forming a first balanced element to electromagnetically couple a first side of the associated unbalanced component; and forming a second balanced element that electromagnetically couples a second side of the associated unbalanced component, electrically coupling the first balanced clement and the second balanced element to form the balanced component.

28. The method of claim 27, wherein the first and second balanced elements comprise conductive strips.

29. The method of claim 18, further comprising orienting the first and second unbalanced components such that the first unbalanced component is parallel with the second unbalanced component.

30. The method of claim 18, further comprising orienting the first and second unbalanced components such that the first unbalanced component is perpendicular to the second unbalanced component.

31. The method of claim 18, further comprising maintaining the first and second balanced components at a potential relative to a ground plane.

32. A balun comprising:

a first unbalanced conductive element disposed on a first layer, a first balanced conductive element disposed on the first layer and oriented for electromagnetic coupling with a first side of unbalanced conductive element;

a second balanced conductive element disposed of the first layer and oriented for electromagnetic coupling with a second side of the first unbalanced conductive element, wherein the first and second balanced conductive elements are electrically coupled to a first balanced port;

a second unbalanced conductive element disposed on a second layer, wherein the first and second unbalanced conductive elements are electrically coupled;

a third balanced conductive element disposed on the second layer and oriented for electromagnetic coupling with a first side of the second unbalanced conductive element; and a fourth balanced conductive element disposed on the second layer and oriented for electromagnetic coupling with a second side of the second unbalanced conductive element, wherein the third and fourth balanced conductive elements are electrically coupled to a second balanced port.

33. The balun of claim 32, wherein at least one of the first and second unbalanced conductive elements are electrically coupled to an unbalanced port.

34. The balun of claim 32, wherein the balanced and unbalanced conductive elements comprise conducting strips.

35. The balun of claim 32, wherein a length of the balanced and unbalanced conductive elements is approximately a quarter of a wavelength of an operating frequency.

* * * * *

UNITED STATES PATENT AND TRADEMARK OFFICE

CERTIFICATE OF CORRECTION

PATENT NO. : 6,759,920 B1 Page 1 of 1
DATED : July 6, 2004
INVENTOR(S) : Philip Cheung and Ramesh Harjani It is certified that error appears in the above-identified patent and that said Letters Patent is hereby corrected as shown below:

Column 12,
Lines 42-43, "balanced" should read -- unbalanced --.
Line 55, "18" should read -- 16 --.

Column 13,
Line 10, "seed" should read -- second --.

Column 14,
Line 23, "of" should read -- on --.

Signed and Sealed this

Fourth Day of April, 2006

JON W. DUDAS
*Director of the United States Patent and Trademark Office*